(12) United States Patent
Higashihara et al.

(10) Patent No.: US 12,359,341 B2
(45) Date of Patent: Jul. 15, 2025

(54) BONDED SUBSTRATE COMPOSED OF SUPPORT SUBSTRATE AND GROUP-13 ELEMENT NITRIDE CRYSTAL SUBSTRATE

(71) Applicant: NGK INSULATORS, LTD., Nagoya (JP)

(72) Inventors: Shuhei Higashihara, Nagoya (JP); Masashi Goto, Nagoya (JP); Ayumi Saito, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 18/584,227

(22) Filed: Feb. 22, 2024

(65) Prior Publication Data

US 2024/0191394 A1 Jun. 13, 2024

Related U.S. Application Data

(63) Continuation of application No. PCT/JP2022/019033, filed on Apr. 27, 2022.

(30) Foreign Application Priority Data

Sep. 22, 2021 (JP) .................. 2021-153852

(51) Int. Cl.
*B32B 9/04* (2006.01)
*B32B 9/00* (2006.01)
(Continued)

(52) U.S. Cl.
CPC .............. *C30B 25/18* (2013.01); *B32B 9/007* (2013.01); *B32B 9/04* (2013.01); *C30B 29/403* (2013.01);
(Continued)

(58) Field of Classification Search
CPC ......... B32B 7/12; C30B 29/38; C30B 29/403; C30B 29/406
See application file for complete search history.

(56) References Cited

U.S. PATENT DOCUMENTS 7,737,441 B2 6/2010 Yamazaki et al.
10,796,905 B2 * 10/2020 Wang .................. H01L 21/0262
(Continued)

FOREIGN PATENT DOCUMENTS

JP 4458116 B2 12/2008
JP 2008300562 A 12/2008
(Continued)

OTHER PUBLICATIONS

English Translation of the International Preliminary Report on Patentability, issued in corresponding International Application No. PCT/JP2022/019033, Date of Mailing Apr. 4, 2024 (7 pages).
(Continued)

*Primary Examiner* — Elizabeth E Mulvaney
(74) *Attorney, Agent, or Firm* — FLYNN THIEL, P.C.

(57) ABSTRACT

It is provided a bonded substrate of a support substrate and group-13 nitride crystal substrate. The group-13 nitride crystal substrate comprises one or more transition metal elements selected from the group consisting of zinc, iron, manganese, nickel and chromium in a concentration of $1 \times 10^{17}$ atoms·cm$^{-3}$ or higher and $1 \times 10^{21}$ atoms·cm$^{-3}$ or lower.

12 Claims, 2 Drawing Sheets

(51) Int. Cl.
  *C30B 25/18*   (2006.01)
  *C30B 29/40*   (2006.01)
  *H01L 21/02*   (2006.01)

(52) U.S. Cl.
  CPC .. *H01L 21/02389* (2013.01); *B32B 2307/538* (2013.01); *B32B 2307/7375* (2023.05); *B32B 2307/748* (2013.01); *H01L 21/0254* (2013.01)

(56) References Cited

U.S. PATENT DOCUMENTS

| | | | |
|---|---|---|---|
| 2008/0296584 A1 | 12/2008 | Hachigo | |
| 2013/0032928 A1* | 2/2013 | Satoh | H01L 21/76254 257/E29.089 |
| 2021/0111076 A1* | 4/2021 | Sekiyama | C30B 31/22 |
| 2021/0234529 A1 | 7/2021 | Uno et al. | |
| 2021/0246571 A1* | 8/2021 | Cardwell | C30B 25/18 |

FOREIGN PATENT DOCUMENTS

| | | | |
|---|---|---|---|
| JP | 2010168227 A | 8/2010 |
| JP | 2010287731 A | 12/2010 |
| JP | 201120896 A | 2/2011 |
| JP | 2012116741 A | 6/2012 |
| JP | 2013191864 A | 9/2013 |
| JP | 201486400 A | 5/2014 |

OTHER PUBLICATIONS

International Search Report with English Translation issued in corresponding International Application No. PCT/JP2022/019033 date of mailing Jun. 28, 2022 (7 pages).
Written Opinion of International Searching Authority issued in corresponding International Application No. PCT/JP2022/019033 dated Jun. 28, 2022 (5 pages).
Notice of Reasons for Refusal with English translation issued in corresponding Japanese Application No. 2023-504559 dated Apr. 12, 2023 (10 pages).
Extended European Search Report issued in corresponding European Application No. 22872450.6, dated Jun. 4, 2025 (8 pages).

* cited by examiner

BONDED SUBSTRATE COMPOSED OF SUPPORT SUBSTRATE AND GROUP-13 ELEMENT NITRIDE CRYSTAL SUBSTRATE

CROSS-REFERENCE TO RELATED APPLICATIONS

This is a continuation of PCT/JP2022/019033, filed Apr. 27, 2022, which claims priority to Japanese Application No. JP2021-153852 filed on Sep. 22, 2021, the entire contents of which are hereby incorporated by reference.

TECHNICAL FIELD

The present invention is related to a bonded substrate of a support substrate and group-13 nitride crystal substrate.

BACKGROUND ART

According to patent document 1, a group-13 nitride crystal substrate and a support substrate, composed of a material whose thermal expansion coefficient is near to that of the group-13 nitride and thermal conductivity is high, are bonded with each other to provide a bonded substrate and a semiconductor epitaxial layer composed of a group-13 nitride is formed on the bonded substrate.

According to patent document 2, a group-13 nitride crystal substrate and a support substrate, composed of a material whose thermal expansion coefficient is near to that of the group-13 nitride and thermal conductivity is high, are indirectly bonded through an oxide film to provide a bonded substrate. Further, according to patent document 3, a group-13 nitride crystal substrate and a support substrate are bonded through a bonding layer to provide a bonded substrate. Such bonded substrates are applied as underlying substrates on which semiconductor epitaxial layers composed of group-13 nitride crystals are film-formed.

PATENT DOCUMENTS (Patent document 1) Japanese patent No. 4458116B
(Patent document 2) Japanese patent Publication No. 2012-116741A
(Patent document 3) Japanese patent Publication No. 2013-191864A

SUMMARY OF THE INVENTION

However, as the present inventors have variously studied the bonded substrate of the group-13 nitride crystal substrate and support substrate, the following problems have been found. That is, processing such as MOCVD process is performed on the bonded substrate for the film formation of the epitaxial layer. In the case when a high temperature is applied during the processing, the group-13 nitride crystal substrate and support substrate may be separated. It is considered that the adhesion of the group-13 nitride crystal substrate and support substrate is not sufficiently good from a microscopic view.

As the present inventors have researched the cause of the separation further, in the case when the group-13 nitride crystal substrate and support substrate are directly bonded, it was found that the adhesion of the bonding surface of the support substrate and bonding surface of the group-13 nitride crystal substrate is low, resulting in a low bonding strength.

Further, in the case when the support substrate and group-13 nitride crystal substrate are bonded through a bonding layer, it was found that the bonding layer with a high bonding strength to the support substrate has a low bonding strength to the group-13 nitride crystal substrate and that the bonding layer with a high bonding strength to the group-13 nitride crystal substrate has a low bonding strength to the support substrate. It was thus shown that it is difficult to improve the bonding strength of the support substrate and group-13 nitride crystal substrate.

An object of the present invention is, in a bonded substrate of a support substrate and group-13 nitride crystal substrate, to improve the bonding strength of the support substrate and group-13 nitride crystal substrate.

The present invention provides a bonded substrate comprising a support substrate and a 13-group nitride crystal substrate, wherein said group-13 nitride crystal substrate comprises one or more transition metal elements selected from the group consisting of zinc, iron, manganese, nickel and chromium in a concentration of $1 \times 10^{17}$ atoms·cm$^{-3}$ or higher and $1 \times 10^{21}$ atoms·cm$^{-3}$ or lower.

The present inventors have successfully and considerably improved the bonding strength of the support substrate and group-13 nitride crystal substrate, by doping a specific transition metal element into the group-13 nitride crystal substrate in a specific amount. It is thereby possible to suppress the separation at an interface between the support substrate and group-13 nitride crystal substrate, in the case when a stress such as a high temperature is applied on the bonded substrate.

MODES FOR CARRYING OUT THE INVENTION

Figure 1A:
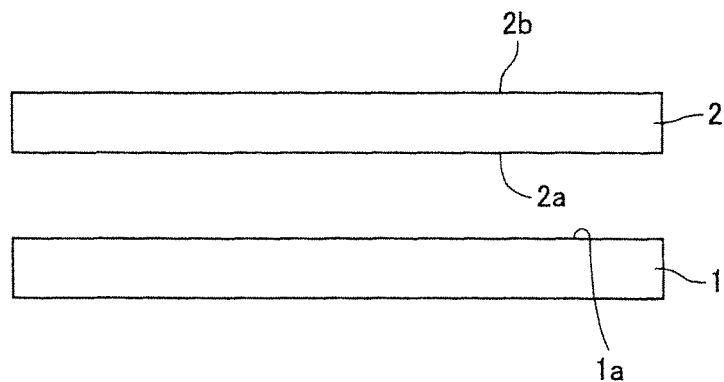
FIG. 1A shows a support substrate and group-13 nitride crystal substrate.

The present invention is related to a bonded substrate of a support substrate and group-13 nitride crystal substrate. The bonded substrate means a substrate obtained by bonding the support substrate and group-13 nitride crystal substrate.

According to a preferred embodiment, the support substrate is composed of gallium nitride, silicon carbide, aluminum nitride or diamond. Alternatively, the support substrate has a film composed of gallium nitride, silicon carbide, aluminum nitride or diamond, and the film is bonded with the group-13 nitride crystal substrate. These materials enhance the bonding strength to the group-13 nitride crystal substrate. In the case when the support substrate has the film composed of gallium nitride, silicon carbide, aluminum nitride, diamond-like carbon or diamond, although the material of an underlying substrate functioning as a base is not particularly limited, the material is preferably silicon, mullite, sapphire, HICERAM, alumina, sialon, gallium nitride, silicon carbide, aluminum nitride or diamond.

As a group-13 nitride constituting the group-13 nitride crystal substrate, gallium nitride, aluminum nitride, indium nitride or the mixed crystals thereof are examples. Specifically, GaN, AlN, InN, $Ga_xAl_{1-x}N$ (1>x>0), $Ga_xIn_{1-x}N$ (1>x>0), $Al_xIn_{1-x}N$ (1>x>0), and $Ga_xAl_yIn_zN$ (1>x>0, 1>y>0, x+y+z=1) are examples.

Particularly preferably, the group-13 nitride is a gallium-nitride series nitride. The gallium nitride-series nitride is GaN, $Ga_xAl_{1-x}N$ (1>x≥0.5), $Ga_xIn_{1-x}N$ (1>x≥0.5), or $Ga_xAl_yIn_zN$ (1>x≥0.5: 0.5>y>0, x+y+z=1). The group-13 nitride is most preferably gallium nitride.

The group 13 nitride crystal substrate contains one or more transition metal elements selected from the group consisting of zinc, iron, manganese, nickel and chromium in a concentration of $1\times10^{17}$ atoms·$cm^{-3}$ or higher and $1\times10^{21}$ atoms·$cm^{-3}$ or lower. Here, the group-13 nitride crystal substrate may contain two or more transition metal elements selected from the group consisting of zinc, iron, manganese, nickel, and chromium, and in this case, the total content of the two or more transition metal elements being $1\times10^{17}$ atoms·$cm^{-3}$ or higher and $1\times10^{21}$ atoms·$cm^{-3}$ or lower.

According to the bonded substrate of the support substrate and group-13 nitride crystal substrate, one or more transition metal elements selected from the group consisting of zinc, iron, manganese, nickel and chromium is incorporated into the group-13 nitride crystal substrate in a concentration of $1\times10^{17}$ atoms·$cm^{-3}$ or higher. The bonding strength of the support substrate and group-13 nitride crystal substrate are thus considerably increased and the separation is suppressed in the case when a high temperature is applied during the subsequent film-formation step of the epitaxial film. The concentration of the one or more transition metal elements of the group-13 nitride crystal substrate is preferably $1\times10^{18}$ atoms·$cm^{-3}$ or higher. Further, as too much transition metal element is doped, local reduction of crystal quality may be substantial and the flatness of the bonding surface is lowered to reduce the bonding strength. The concentration is thus preferably $1\times10^{21}$ atoms·$cm^{-3}$ or lower and more preferably $1\times10^{10}$ atoms·$cm^{-3}$ or lower.

The concentration of the transition metal element of the group-13 nitride crystal substrate is measured by a secondary ion mass spectrometry (D-SIMS). The measurement is performed by measuring the concentration of the transition metal element in a depth of 3 μm from the surface of the substrate. One normal position is selected, at which the doped state of the transition metal element is considered to be stabilized in the vicinity of the center of the substrate, as a measuring point. The judgement of the normal position is performed by confirming, with eyes and an optical microscope, that there are no abnormal positions, such as an inclusion, unevenness of color concentration or three-dimensional growth, in a region of Φ 10 mm around the measurement point. The value at a depth of 2 μm, where the concentration is constant in the direction of the depth, is defined as the concentration of the transition metal element of the substrate.

Among the transition metal elements, the primary ions and secondary ions of manganese, iron, nickel and chromium are detected through $O_2$ beam and plus ions, respectively. The primary ions and secondary ions of zinc are detected through Cs ion beam and plus ions, respectively.

Further, the measurement of impurity elements including the one or more transition metal elements on the surface of the group-13 nitride crystal substrate is performed by total reflection X-ray fluorescence analysis (TXRF method). Although the concentration of impurities including the transition metal elements on the surface of the substrate is preferably lower, it is difficult to apply a strong cleaning agent while avoiding deterioration of the flatness of the bonding surface. Thus, from the viewpoint of assuring the flatness of the bonding surface of the nitride crystal without affecting the bonding strength, the total of the concentration of the impurities is preferably $6\times10^{12}$ atoms·$cm^{-2}$ or higher and $1\times10^{14}$ atoms·$cm^{-2}$ or lower.

According to a preferred embodiment, the bonding surface of the group-13 nitride crystal substrate and bonding surface of the support substrate are directly bonded.

Figure 1B:
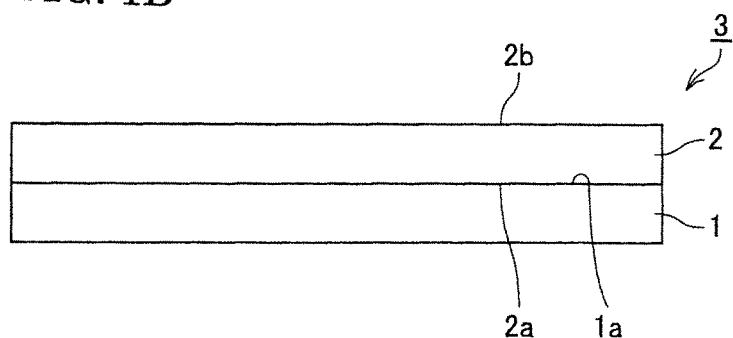
FIG. 1B shows a bonded substrate of the support substrate and group-13 nitride crystal substrate.
Figure 1C:
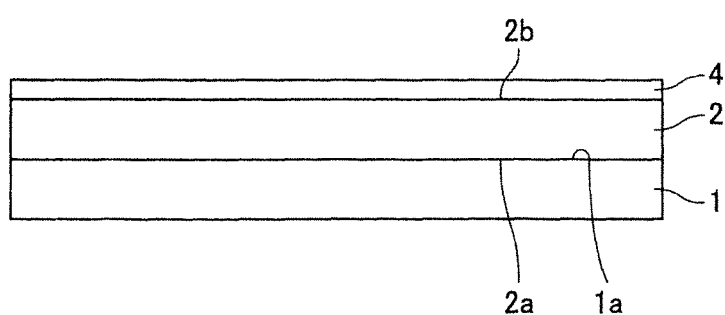
FIG. 1C shows the state that an epitaxial film is film-formed on the group-13 nitride crystal substrate of the bonded substrate.

For example, according to an embodiment of FIGS. 1A to 1C, as shown in FIG. 1A, a bonding surface 1a of a support substrate 1 and bonding surface 2a of a group-13 nitride crystal substrate 2 are opposed. The bonding surface 1a of the support substrate 1 and bonding surface 2a of the group-13 nitride crystal substrate 2 are then subjected to surface activation and then bonded as shown in FIG. 1B, to provide a bonded substrate 3. As shown in FIG. 1C, a desired epitaxial film 4 is then film-formed on a film-forming face 2b of the group-13 nitride crystal substrate 2.

Alternatively, a bonding layer may be provided between the group-13 nitride crystal substrate and support substrate.

Figure 2A:
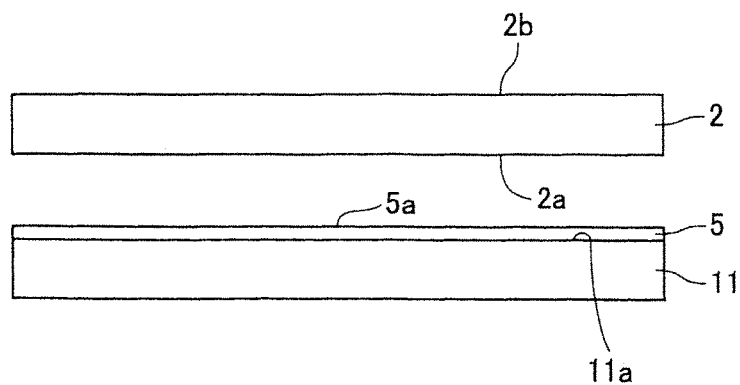
FIG. 2A shows the support substrate, the group-13 nitride crystal substrate and a bonding layer.
Figure 2B:
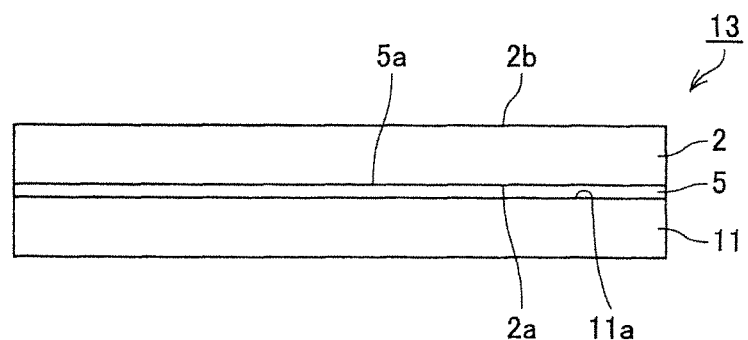
FIG. 2B shows a bonded substrate of the support substrate and group-13 nitride crystal substrate.
Figure 2C:
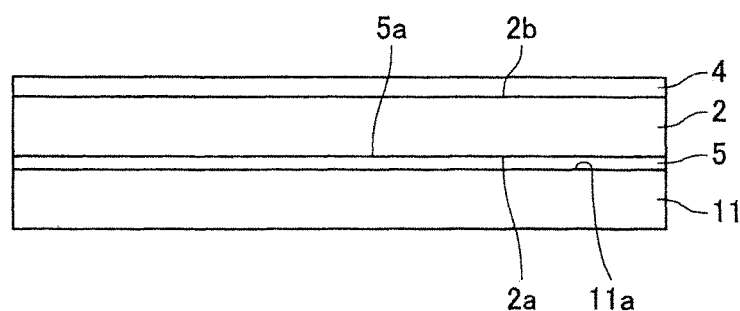
FIG. 2C shows the state that the epitaxial film is film-formed on the group-13 nitride crystal substrate of the bonded substrate.

For example, according to an embodiment of FIGS. 2A to 2C, as shown in FIG. 2A, a bonding surface 5a of a bonding layer 5 on a main face 11a of a support substrate 11 is opposed to the bonding surface 2a of the group-13 nitride crystal substrate 2. The bonding surface 5a of the bonding layer 5 and bonding surface 2a of the group-13 nitride crystal substrate 2 are then subjected to surface activation and then bonded as shown in FIG. 2B, to obtain a bonded substrate 13. Then, as shown in FIG. 2C, the desired epitaxial film 4 is film-formed on the film-forming face 2b of the group 13 nitride crystal substrate 2.

Further, according to an example of FIGS. 2A to 2C, the bonding layer 5 is provided on the main face 11a of the support substrate 11, and the bonding surface 5a of the bonding layer 5 is directly bonded with the bonding surface 2a of the group-13 nitride crystal substrate 2. However, the following embodiments are applicable.

(1) A bonding layer is provided on the main face of the group-13 nitride crystal substrate 2, and the bonding surface of the bonding layer is directly bonded with the bonding surface 1a of the support substrate 1.

(2) A first bonding layer is provided on the main face of the group-13 nitride crystal substrate 2, and a second bonding layer is provided on the main face of the support substrate. The bonding surface of the first bonding layer is directly bonded with the bonding surface of the second bonding layer.

According to a preferred embodiment, the bonding layer is composed of tantalum pentoxide, alumina, aluminum nitride, silicon carbide, sialon or $Si_{(1-x)}O_x$ (0.008≤x≤0.408). It is thereby possible to further improve the bonding strength of the support substrate and group-13 nitride crystal substrate.

Besides, sialon is a ceramic obtained by sintering mixture of silicon nitride and alumina, and has the following composition.

That is, sialon has a composition in which alumina is mixed into silicon nitride, and z indicates the ratio of the mixed alumina. z may more preferably be 0.5 or higher. Further, z may more preferably be 4.0 or lower.

The present invention is particularly suitable in the case that the bonded substrate is of a large size. The outer diameter of the bonded substrate is more preferably 4 inches or larger (100 mm or larger).

In the case when the group-13 nitride crystal substrate and support substrate are directly bonded, although the main face of the group-13 nitride crystal substrate is not particularly limited, it may be Ga plane or N plane. Further, the bonding surface of the group-13 nitride crystal substrate may be c-plane, a-plane or m-plane of Wurtzite structure, or may be a plane inclined with respect to the c-plane, a-plane or m-plane.

In the case when the group-13 nitride crystal substrate and support substrate are directly bonded through the bonding layer provided therebetween, although the main face of the group-13 nitride crystal substrate is not particularly limited, it may be Ga plane or N plane. Further, the bonding surface of the group-13 nitride crystal substrate may be c-plane, a-plane or m-plane of Wurtzite structure, or may be a plane inclined with respect to the c-plane, a-plane or m-plane.

Although the method of producing the group-13 nitride crystal substrate is not particularly limited, vapor phase methods such as MOCVD (Metal Organic Chemical Vapor Deposition) method, hydride vapor phase epitaxy (HVPE) method, pulse excitation deposition (PXD) method, MBE method, sublimation method and the like and liquid phase methods such as ammonothermal method, flux method and the like may be used.

As the epitaxial crystal grown on the bonded substrate, gallium nitride, aluminum nitride, indium nitride or the mixed crystals thereof are examples. Specifically, GaN, AlN, InN, $Ga_xAl_{1-x}N$ (1>x>0), $Ga_xIn_{1-x}N$ (1>x>0), $Al_xIn_{1-x}N$ (1>x>0) and $Ga_xAl_yIn_zN$ (1>x>0, 1>y>0, x+y+z=1) are examples. Further, as a functional layer provided on the bonded substrate, a rectifying element layer, switching element layer, power semiconductor layer and the like are examples in addition to a light emitting layer. Further, after the functional layer is provided on the group-13 nitride polarity surface of the self-standing substrate, the nitrogen polarity surface may be subjected to processing, for example grinding or polishing process, to reduce the thickness or the deviation of the thickness of the bonded substrate.

Further, the temperature during the film-formation of the epitaxial film provided on the bonded substrate is preferably 900 to 1200° C. and more preferably 950 to 1150° C. The separation is suppressed in the bonded substrate of the present invention, even in the case when it is exposed to such high temperature.

Preferred bonding processes will be further described below.

First, the respective bonding surfaces to be bonded (bonding surface of the group-13 nitride crystal substrate, bonding surface of the support substrate and bonding surfaces of the respective bonding layers) are flattened to obtain flattened faces. Here, the method of flattening the respective faces may be lapping (lap), chemical mechanical polishing (CMP) or the like. Further, the arithmetic average roughness Ra of the flattened face may preferably be 1.0 nm or lower and more preferably be 0.5 nm or lower.

Then, the respective bonding surfaces are cleansed for removing the residue of a polishing agent and processing deformation layer. The method of cleaning the respective bonding surfaces may be wet cleaning, dry cleaning, scrub cleaning and the like, and scrub cleaning is preferred for obtaining a clean surface easily and efficiently. Although a cleaning agent for the cleaning is not particularly limited, for example, Sun Wash LH540 may be applied as the cleaning agent followed by cleaning by means of a scrub cleaning machine with mixed solution of acetone and IPA.

A neutralized beam may be then irradiated onto the respective bonding surfaces to activate the respective bonding surfaces.

When the surface activation is performed using the neutralized beam, it is preferred to use a system described in Japanese Patent Publication No. 2014-086400A to generate the neutralized beam, which is irradiated. That is, a high-speed atomic beam source of saddle field type is used as the beam source. Then, inert gas is introduced into a chamber and a high voltage is applied onto electrodes from a direct current electric source. By this, an electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high-speed atomic beam source. The atomic specie providing the beam is preferably an inert gas (argon, nitrogen or the like).

In the activation step by beam irradiation, the voltage is preferably 0.5 to 2.0 kV, and the current is preferably 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding is more preferably 20° C. or higher and 25° C. or lower. The applied pressure at the bonding is preferably 100 to 20000N.

EXAMPLES

Inventive Example 1

A bonded body 3 was fabricated according to the method described referring to FIGS. 1A to 1C.

Specifically, a seed crystal film composed of gallium nitride was provided on an underlying substrate composed of sapphire to provide a gallium nitride template (diameter of the substrate was 4.0 inches). The thickness of the seed crystal film was 2 μm.

A gallium nitride crystal layer of a thickness of 1 mm was then formed by Na flux method. The gallium nitride crystal layer was then separated by laser lift-off method to obtain a gallium nitride crystal substrate 2 having a thickness of 1 mm.

Further, a support substrate 1 composed of aluminum nitride sintered body and having a thickness of 0.5 mm was prepared.

The bonding surface 2a of the gallium nitride crystal substrate 2 and bonding surface 1a of the support substrate were polished, respectively, until the arithmetic surface roughnesses Ra were 0.2 nm.

Neutralized beams were then irradiated onto the bonding surface 2a of the gallium nitride crystal substrate 2 and bonding surface 1a of the support substrate 1, respectively, to activate the respective bonding surfaces, which were directly bonded.

Specifically, after the respective bonding surfaces were cleansed to remove contamination, the gallium nitride crystal substrate 2 and support substrate 1 were introduced into a vacuum chamber. After the inside of the vacuum chamber was suctioned into vacuum on the order of $10^{-6}$ Pa, a high-speed atomic beam (acceleration voltage of 1 kV and Ar flow rate of 27 sccm) was irradiated onto the respective bonding surfaces for 120 seconds. After the bonding surface 2a of the gallium nitride crystal substrate 2 and bonding surface 1a of the support substrate 1 were then contacted, pressurization at 10000N was performed over 2 minutes to perform the bonding.

However, according to the present example, zinc metal was added into a melt for performing the Na flax method, so that zinc was incorporated into the gallium nitride crystal substrate 2 in a concentration shown in table 1.

The bonding strengths of the thus obtained boded bodies were measured by crack opening method and the results were shown in Table 1. However, in the case that the bonding strength exceeds 1.75 J/m², it is described as "Bulk fracture".

SIMS analysis was performed to determine the respective concentrations of manganese, iron, nickel, chromium and zinc contained in the gallium nitride crystal substrate 2. The total of the thus obtained concentrations of the respective elements was calculated and shown in Table 1 as the concentration of transition metal elements.

Inventive Example 2 to Inventive Example 13

The respective bonded bodies shown in tables 1 and 2 were produced as was Inventive Example 1. However, the outer diameter of the bonded substrate, material of the group 13 nitride crystal substrate, material of the support substrate, and kind and concentration of the transition metal element contained in the group-13 nitride crystal substrate were changed as shown in Tables 1 and 2. The bonding strength of the thus obtained bonded body was considerably improved and the separation was not observed between the gallium nitride crystal substrate and support substrate even after MOCVD process. The results of the measurement of the bonding strengths are shown in Tables 1 and 2.

As shown in Tables 1 and 2, according to the present invention, the bonding strength of the bonded substrate was considerably improved to result in bulk fracture.

Comparative Examples 1 to 4

The respective bonded substrates shown in Table 3 were produced as with Inventive Example 1. However, the outer diameter of the bonded substrate, material of the group-13 nitride crystal substrate, material of the support substrate, and kind and concentration of the element contained in the group-13 nitride crystal substrate were changed as shown in Table 3. The bonding strength of the thus obtained bonded body was low and the separation occurred between the gallium nitride crystal substrate and support substrate after the MOCVD process. The results of measurement of the bonding strengths are shown in Table 3.

TABLE 1

|  | Inv. Ex. 1 | Inv. Ex. 2 | Inv. Ex. 3 | Inv. Ex. 4 | Inv. Ex. 5 | Inv. Ex. 6 |
|---|---|---|---|---|---|---|
| Outer diameter | 4 inches | 4 inches | 4 inches | 4 inches | 4 inches | 4 inches |
| Group 13 nitride crystal substrate | GaN | GaN | GaN | GaN | GaN | GaN |
| Support substrate | AlN | SiC | Diamond | AlN | AlN | AlN |
| Transition Metal Element | Zn | Zn | Zn | Zn | Mn | Fe, Ni, Cr |
| Concentration of Transition Metal Element (atoms cm-3) | $1 \times 10^{19}$ | $1 \times 10^{19}$ | $7 \times 10^{18}$ | $2 \times 10^{19}$ | $1 \times 10^{19}$ | $1 \times 10^{19}$ |
| Bonding Strength (J/m2) | Bulk fracture | Bulk fracture | Bulk fracture | Bulk fracture | Bulk fracture | Bulk fracture |

TABLE 2

|  | Inv. Ex. 7 | Inv. Ex. 8 | Inv. Ex. 9 | Inv. Ex. 10 | Inv. Ex. 11 | Inv. Ex. 12 | Inv. Ex. 13 |
|---|---|---|---|---|---|---|---|
| Outer diameter Group III nitride crystal substrate | 4 inches GaN | 4 inches GaN | 4 inches GaN | 4 inches GaN | 4 inches GaN | 4 inches GaN | 4 inches GaN |
| Support substrate | diamond/Si | AlN/sapphire | AlN | AlN | AlN | AlN | AlN |
| Transition Metal Element | Zn | Zn | Zn | Zn | Zn | Zn | Zn, Fe, Mn, Cr |
| Concentration of Transition Metal Element (atoms cm$^{-3}$) | $1 \times 10^{19}$ | $7 \times 10^{18}$ | $1 \times 10^{17}$ | $1 \times 10^{18}$ | $1 \times 10^{20}$ | $1 \times 10^{21}$ | $6 \times 10^{18}$ |
| Bonding Strength (J/m$^2$) | Bulk fracture | Bulk fracture | 1.75 | Bulk Fracture | Bulk Fracture | 1.75 | Bulk Fracture |

TABLE 3

|  | Com. Ex. 1 | Com. Ex. 2 | Com. Ex. 3 | Com. Ex. 4 |
|---|---|---|---|---|
| Outer diameter Group 13 nitride crystal substrate | 4 inches GaN | 4 inches GaN | 4 inches GaN | 4 inches GaN |
| Support substrate | AlN | AlN | AlN | AlN |
| Element | Si | Ge | Zn | Zn |
| Concentration of Element (atoms cm$^{-3}$) | $1 \times 10^{19}$ | $1 \times 10^{19}$ | $8 \times 10^{16}$ | $2 \times 10^{21}$ |

TABLE 3-continued

|  | Com. Ex. 1 | Com. Ex. 2 | Com. Ex. 3 | Com. Ex. 4 |
|---|---|---|---|---|
| Bonding Strength (J/m$^2$) | 0.75 | 0.75 | 1.2 | 1.0 |

As a result, according to the Comparative Examples 1 and 2, as Si or germanium was applied as the element contained in the gallium nitride crystal substrate, the bonding strength was considerably lower compared with those in the inventive examples even in the case the concentration range of the present invention was satisfied.

Further, for Comparative Examples 3 and 4, zinc was applied as the element contained in the gallium nitride crystal substrate as with Inventive Example 1. However, as the concentration was out of the concentration range of the present invention, the bonding strength was considerably reduced compared with those of the inventive examples.

Further, the concentrations of impurity elements (silicon, chlorine, manganese, iron, copper and zinc) on the surface of the gallium nitride crystal substrate in each inventive example were measured by total internal reflection X-ray fluorescence analysis (TXRF method). The surfaces of the gallium nitride crystal substrates in the respective inventive examples were subjected to cleaning before the bonding. Then, the central part (about Φ of 1 cm) of the surface of the gallium nitride crystal substrate of each inventive example was measured by TXRF method to prove that the total concentrations were $8\times10^{12}$ to $5\times10^{13}$ atoms·cm$^{-2}$.

The invention claimed is:

1. A bonded substrate comprising a support substrate and a group-13 nitride crystal substrate,
   wherein said group-13 nitride crystal substrate comprises one or more transition metal elements selected from the group consisting of zinc, iron, manganese, nickel and chromium in a concentration of $1\times10^{17}$ atoms·cm$^{-3}$ or higher and $1\times10^{21}$ atoms·cm$^{-3}$ or lower,
   wherein a bonding surface of said group-13 nitride crystal substrate and a bonding surface of said support substrate are directly bonded with each other, and
   said support substrate comprises silicon carbide, aluminum nitride or diamond.

2. The bonded substrate of claim 1, wherein said bonding surface of said group-13 nitride crystal substrate and said bonding surface of said support substrate are directly bonded by a surface activation method.

3. The bonded substrate of claim 2, wherein said bonding surface of said group-13 nitride crystal substrate and said bonding surface of said support substrate are subjected to surface activation through a neutralized atomic beam.

4. The bonded substrate of claim 1, wherein said group-13 nitride crystal substrate comprises gallium nitride.

5. The bonded substrate of claim 1, wherein said bonded substrate has an outer diameter of 4 inches or larger.

6. The bonded substrate of claim 1, wherein said transition metal element comprises zinc.

7. The bonded substrate of claim 4, wherein said transition metal element comprises zinc.

8. The bonded substrate of claim 1, wherein said support substrate comprises aluminum nitride.

9. The bonded substrate of claim 4, wherein said support substrate comprises aluminum nitride.

10. The bonded substrate of claim 7, wherein said support substrate comprises aluminum nitride.

11. The bonded substrate of claim 1, wherein said bonded substrate has a bonding strength of at least 1.75 J/m$^2$.

12. The bonded substrate of claim 1, wherein a total content of impurity elements measured on said bonding surface of said group-13 nitride crystal substrate is $6\times10^{12}$ atoms·cm$^{-2}$ or higher and $1\times10^{14}$ atoms·cm$^{-2}$ or lower.

* * * * *